United States Patent
Yin et al.

(10) Patent No.: US 8,546,241 B2
(45) Date of Patent: **\*Oct. 1, 2013**

(54) SEMICONDUCTOR DEVICE WITH STRESS TRENCH ISOLATION AND METHOD FOR FORMING THE SAME

(75) Inventors: Haizhou Yin, Poughkeepsie, NY (US); Zhijiong Luo, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/257,725

(22) PCT Filed: Jan. 27, 2011

(86) PCT No.: PCT/CN2011/070691
§ 371 (c)(1),
(2), (4) Date: Sep. 20, 2011

(87) PCT Pub. No.: WO2012/055182
PCT Pub. Date: May 3, 2012

(65) Prior Publication Data
US 2012/0061735 A1 Mar. 15, 2012

(30) Foreign Application Priority Data
Oct. 29, 2010 (CN) .......................... 2010 1 0527238

(51) Int. Cl.
*H01L 21/76* (2006.01)
(52) U.S. Cl.
USPC ............ 438/424; 438/618; 438/675; 438/740

(58) Field of Classification Search
USPC .................. 438/424, 618, 675, 740
See application file for complete search history.

(56) References Cited

U.S. PATENT DOCUMENTS

| | | | |
|---|---|---|---|
| 7,081,395 B2 * | 7/2006 | Chi et al. | 438/424 |
| 7,268,399 B2 | 9/2007 | Bowen et al. | |
| 7,410,858 B2 * | 8/2008 | Ma et al. | 438/221 |
| 7,436,030 B2 | 10/2008 | Yang et al. | |

(Continued)

FOREIGN PATENT DOCUMENTS

CN 1841737 A 10/2006

OTHER PUBLICATIONS

International Search Report and Written Opinion of the ISA (in Chinese) for PCT/CN2011/070691, mailed Jul. 14, 2011.

*Primary Examiner* — Luan C Thai
(74) *Attorney, Agent, or Firm* — Harness, Dickey & Pierce, P.L.C.

(57) ABSTRACT

A semiconductor device with stress trench isolation and a method for forming the same are provided. The method includes: providing a silicon substrate; forming first trenches and second trenches on the silicon substrate, wherein an extension direction of the first trenches is perpendicular to that of the second trenches; forming a first dielectric layer in the first trenches and forming a second dielectric layer in the second trenches; and forming a gate stack on a portion of the silicon substrate surrounded by the first trenches and the second trenches, wherein a channel length direction under the gate stack is parallel to the extension direction of the first trenches, indices of crystal plane of the silicon substrate are {100}, and the extension direction of the first trenches is along the crystal orientation <110>. The embodiments of the present invention can improve response speed and performance of the devices.

15 Claims, 7 Drawing Sheets

(56) References Cited

U.S. PATENT DOCUMENTS

| | | | |
|---|---|---|---|
| 7,547,641 B2 | 6/2009 | Leong et al. | |
| 7,834,414 B2 * | 11/2010 | Suzuki et al. | 257/506 |
| 8,232,178 B2 * | 7/2012 | Yin et al. | 438/424 |
| 2008/0237725 A1 | 10/2008 | Suzuki et al. | |

* cited by examiner

SEMICONDUCTOR DEVICE WITH STRESS TRENCH ISOLATION AND METHOD FOR FORMING THE SAME

CROSS REFERENCE TO RELATED APPLICATIONS

The present application is a National Phase application of, and claims priority to, PCT Application No. PCT/CN2011/070691, filed on Jan. 27, 2011, entitled "Semiconductor Device with Stress Trench Isolation and Method for Forming the same", which claimed the priority of Chinese Patent Application No. 201010527238.1, filed on Oct. 29, 2010.

Both the PCT Application and Chinese Application are incorporated herein by reference in their entireties.

FIELD OF THE INVENTION

This invention is generally related to semiconductor manufacturing field, and particularly to a semiconductor device with stress trench isolation and a method for forming the same.

BACKGROUND OF THE INVENTION

Shallow trench isolation (STI) technology is generally used to insulate adjacent NMOS and PMOS devices in the formation of complementary metal-oxide semiconductor (CMOS) devices.

As described in U.S. Pat. No. 7,436,030, with the dimension of semiconductor device continuously scaling down, STI becomes a preferable electrical isolation method for CMOS devices. This is because STI stress can introduce strain of the channel, which will improve the whole performance of the semiconductor device. However, as known for those skilled in the art, for CMOS devices, when STI stress improves the performance of one type of MOS transistors, e.g. NMOS transistors, it lowers the performance of the other type of MOS transistors, e.g. PMOS transistors. For instance, STI tensile stress can improve the driving current of NMOS transistors by increasing electron mobility, however, at the same time, decrease carrier mobility, and thus reduce the driving current of the neighboring PMOS transistors.

Therefore, a new STI process and a new corresponding semiconductor device is needed to solve the problems caused by the traditional STI process, so that the stress provided by the STI can be fully used in MOS transistors.

SUMMARY OF THE INVENTION

One object of the present invention is to solve the problem that traditional STI stress can only supply driving current for a single type of MOS transistors and to make full use of the stress for MOS transistors supplied by STI.

To achieve the object, a method for forming a semiconductor device with stress trench isolation is provided, comprising:

providing a silicon substrate;

forming first trenches and second trenches on the silicon substrate, wherein an extension direction of the first trenches is perpendicular to that of the second trenches;

forming a first dielectric layer, which is under tensile stress, in the first trenches and forming a second dielectric layer in the second trenches; and forming a gate stack on a portion of the silicon substrate surrounded by the first trenches and the second trenches, wherein a channel length direction under the gate stack is parallel to the extension direction of the first trenches, the silicon substrate has {100} crystal indices, and the extension direction of the first trenches is along <110> crystal orientation.

Optionally, the second dielectric layer is a low stress dielectric layer.

Optionally, the low stress dielectric layer has a tensile stress of no more than 180 MPa.

Optionally, the low stress dielectric layer comprises one of a low stress silicon nitride layer and a low stress silicon oxide layer, or a stack of both.

Optionally, the tensile stress dielectric layer has a tensile stress of at least 1 GPa.

Optionally, the tensile stress dielectric layer comprises one of a tensile stress silicon nitride layer and a tensile stress silicon oxide layer, or a stack of both.

Optionally, forming first trenches and second trenches on the silicon substrate comprises:

forming a liner layer and a hard mask layer on the silicon substrate sequentially;

forming a photoresist layer on the hard mask layer and patterning the photoresist layer to define patterns of the first trenches and the second trenches;

etching the liner layer and the hard mask layer by using the patterned photoresist layer as a mask, and removing the photoresist layer; and etching the silicon substrate by using the hard mask layer as a mask so as to form the first trenches and the second trenches.

Optionally, forming a first dielectric layer, which is under tensile stress, in the first trenches and forming a second dielectric layer in the second trenches comprises:

forming a second dielectric layer in both the first trenches and the second trenches, and planarizing the second dielectric layer until the top surface of the second dielectric layer is flushed with that of the silicon substrate;

removing a portion of the second dielectric layer in the first trenches; and forming a first dielectric layer in the first trenches, and planarizing the first dielectric layer until the top surface of the first dielectric layer is flushed with that of the silicon substrate.

Optionally, forming a first dielectric layer, which is under tensile stress, in the first trenches and forming a second dielectric layer in the second trenches comprises:

forming the first dielectric layer in both the first trenches and the second trenches, and planarizing the first dielectric layer until the top surface of the first dielectric layer is flushed with that of the silicon substrate;

removing a portion of the first dielectric layer in the second trenches; and forming the second dielectric layer in the second trenches, and planarizing the second dielectric layer until the top surface of the second dielectric layer is flushed with that of the silicon substrate.

Optionally, the semiconductor device is an NMOS transistor and/or a PMOS transistor.

In another embodiment, a semiconductor device with stress trench isolation comprises:

a silicon substrate;

first trenches and second trenches formed in the silicon substrate, wherein an extension direction of each of the first trenches is perpendicular to that of the second trenches, a first dielectric layer, which is under tensile stress, is formed in the first trenches, and a second dielectric layer is formed in the second trenches; and a gate stack formed on a portion of the silicon substrate surrounded by the first trenches and the second trenches, wherein a channel length direction under the gate stack is parallel to the extension direction of the first trenches, the silicon substrate has {100} crystal indices, and the extension direction of the first trenches is along <110> crystal orientation.

Optionally, the second dielectric layer is a low stress dielectric layer.

Optionally, the low stress dielectric layer has a tensile stress of no more than 180 MPa.

Optionally, the low stress dielectric layer comprises one of a low stress silicon nitride layer and a low stress silicon oxide layer, or a stack of both.

Optionally, the tensile stress dielectric layer has a tensile stress of at least 1 GPa.

Optionally, the tensile stress dielectric layer comprises one of a tensile stress silicon nitride layer and a tensile stress silicon oxide layer, or a stack of both.

Optionally, the semiconductor device is an NMOS transistor and/or a PMOS transistor.

When the channel direction of a MOS transistor on a {100} wafer is <110>, in the channel width direction of the MOS transistor, tensile stress improves the performance of NMOS transistors as well as that of PMOS transistors. In contrast, in the channel length direction of the MOS transistors, the preferable stress type of the PMOS transistors and NMOS transistors is different. In other words, in the channel length direction, the preferable stress type of the PMOS transistor is compressed stress and the preferable stress type of the NMOS transistor is tensile stress.

Compared with the prior art, the present invention has the following advantages.

In the semiconductor devices of the embodiments of the present invention, tensile stress dielectric layers is filled in the first trenches with the direction parallel to the channel length direction of the MOS transistor, namely, in the channel width direction, the tensile stress dielectric layers are on both sides of the MOS transistor, so as to supply a tensile stress to the channel width direction of the MOS transistor through a trench isolation structure, thereby increasing the response speed of the MOS transistor and improving the performance of the device. Furthermore, the embodiments of the present invention, which are applicable not only in PMOS transistors, but also in NMOS transistors, can improve the performance of the whole CMOS circuit.

Moreover, in the semiconductor manufacture process of 45 nm and even lower technical node, the extension directions of all gates are the same so as to simplify the gate lithography, namely the channel length direction and the channel width direction of all MOS transistors are consistent. Thus, the embodiments of the present invention can be widely applied in the semiconductor manufacture process of 45 nm and even lower technical node, which offer tensile stress in the channel width direction of all the MOS transistors and improve the performance of the device. Therefore, the embodiments of the present invention can not only fully use the STI stress, but also can improve the performance of both of the PMOS and NMOS transistors. Meanwhile, the embodiments are easy to perform and very practical in industry.

DETAILED DESCRIPTION OF THE EMBODIMENTS

Stress STI process in the prior art can only improve the performance of a single type of transistors, rather than the performance of both types of transistors (namely, PMOS and NMOS transistors) in CMOS transistors simultaneously, which limits the application of the traditional stress STI process.

In the embodiments of the present invention, tensile stress dielectric layers are filled in the first trenches which are parallel to the channel length direction of a MOS transistor. Namely, the tensile stress dielectric layers are on two opposite sides of the MOS transistor in the channel width direction, so that the tensile stress is applied along the channel width direction of the MOS transistor, which benefits the MOS transistor by increasing the response speed and improving the performance of the device. Furthermore, the present invention is applicable to both PMOS transistors and NMOS transistors, namely, applicable to the standard CMOS process.

Hereafter, the present invention will be described in detail with reference to embodiments in conjunction with the accompanying drawings.

Although the present invention has been disclosed hereinafter as above with reference to preferred embodiments in detail, it can be implemented in other different embodiments. Therefore, the present invention should not be limited to the embodiments disclosed herein.

Figure 1:
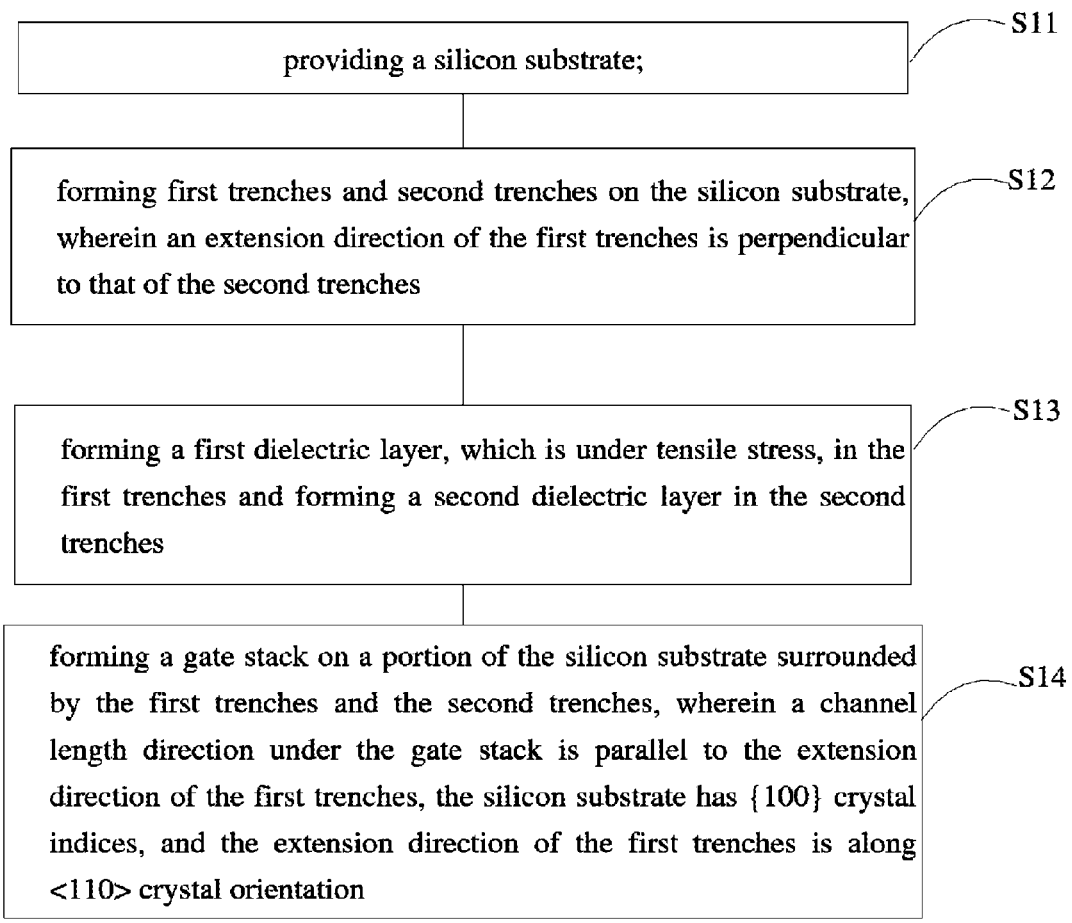
FIG. 1 is a flow chart of a method for forming a semiconductor device with stress trench isolation according to one embodiment of the present invention.

FIG. 1 is a flow chart of a method for forming a semiconductor device with stress trench isolation according to one embodiment of the present invention. As shown in FIG. 1, the method comprises:

Step S11, providing a silicon substrate;

Step S12, forming first trenches and second trenches on the silicon substrate, wherein an extension direction of the first trenches is perpendicular to that of the second trenches;

Step S13, forming a first dielectric layer in the first trenches which is a tensile stress dielectric layer, and forming a second dielectric layer in the second trenches; and Step S14, forming a gate stack on a portion of the silicon substrate surrounded by both the first trenches and the second trenches, wherein a channel length direction under the gate stack is parallel to the extension direction of the first trenches, the silicon substrate has {100} crystal indices, and the extension direction of the first trenches is along the crystal orientation <110>.

Referring to FIG. 1, and FIGS. 2-8c, specific description of an embodiment of the method for forming a semiconductor device with stress trench isolation is as follows.

Figure 2:
FIG. 2 and FIG. 3 are cross-sectional views of intermediate structures in the method for forming the semiconductor device with stress trench isolation according to the embodiment of the present invention.

Referring to FIG. 1 and FIG. 2, Step S11 is performed to provide a silicon substrate. Specifically, as shown in FIG. 2, the silicon substrate 10 is provided. Preferably, the silicon substrate 10 has {100} crystal indices, namely, the silicon substrate 10 has crystal indices belonging to the {100} family.

As an unlimited embodiment of the invention, the silicon substrate 10 has (100) crystal indices.

Referring to FIG. 1, FIG. 3, and FIG. 4a to FIG. 4c, Step S12 is performed to form the first trenches and the second trenches on the silicon substrate. The extension direction of the first trenches is perpendicular to that of the second trenches. According to practical requirements, there may be at least two first trenches and at least two second trenches.

Figure 3:
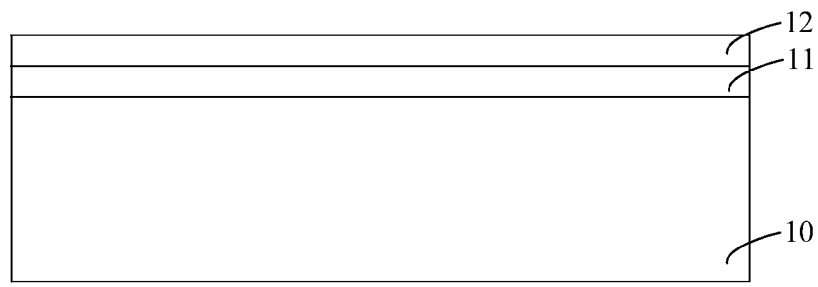

Firstly, as shown in FIG. 3, a liner layer 11 and a hard mask layer 12 are formed on the silicon substrate 10. FIG. 3 is a cross-sectional view corresponding to this step. The liner layer 11 may comprise silicon oxide, and the hard mask layer 12 may comprise silicon nitride. The hard mask layer 12 can be used as a hard mask in the following etching process.

Thereafter, the first trenches and the second trenches are formed on the silicon substrate 10. Specifically, the method for forming the first trenches and the second trenches comprises: forming a photoresist layer (not shown in the figures) on the hard mask layer 12 and patterning the photoresist layer to define the patterns of the first trenches and the second trenches; etching the liner layer 11 and the hard mask layer 12 by using the patterned photoresist layer as a mask, and then removing the photoresist layer by using an ashing process and the like; etching the silicon substrate 10 by using the etched hard mask layer 12 as a mask to form the first trenches and the second trenches. Of course, in other embodiments, the first trenches and the second trenches may be formed by directly performing lithography and etching to the silicon substrate 10 without forming the liner layer 11 and the hard mask layer 12.

Figure 4A:
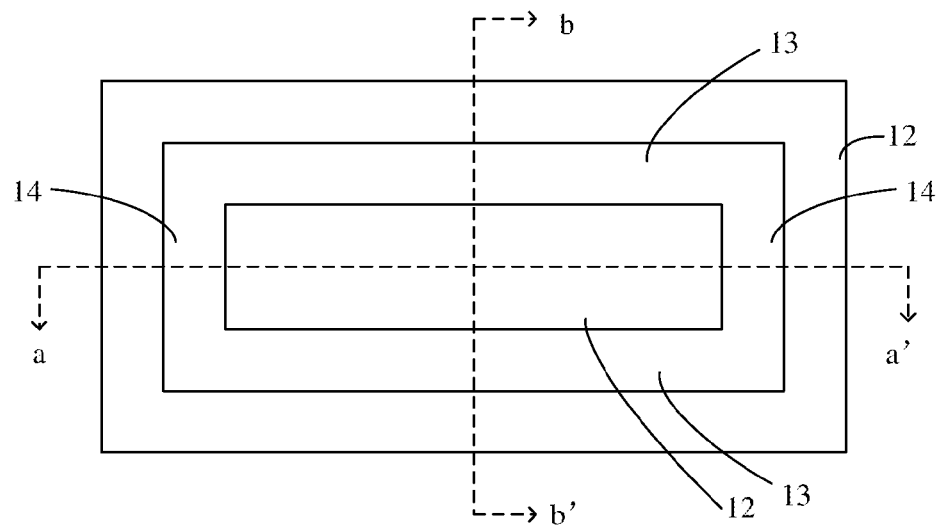
FIGS. 4a-8c are top views and the corresponding cross-sectional views of intermediate structures in the method for forming the semiconductor device with stress trench isolation according to the embodiment of the present invention.
Figure 4B:
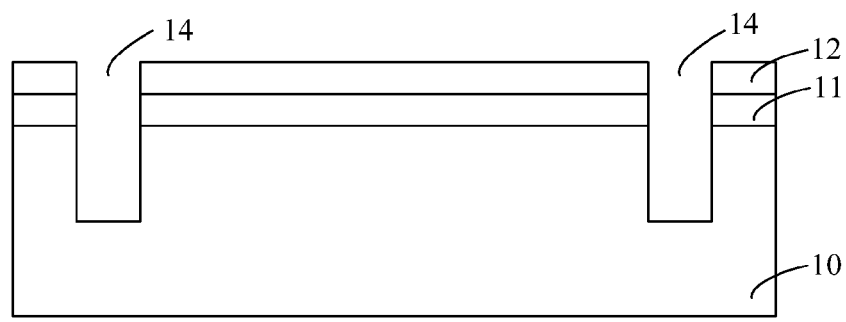
Figure 4C:
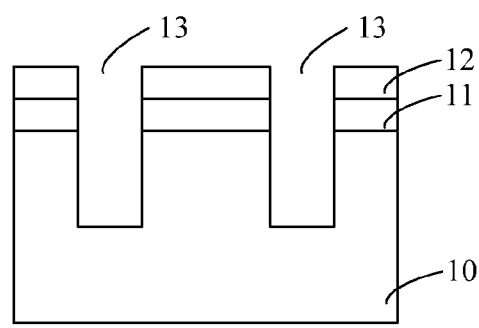

Specifically, FIG. 4a is a top view of an intermediate structure after the first trenches and the second trenches are formed according to the embodiment, FIG. 4b is a cross-sectional view along a-a' direction of FIG. 4a, and FIG. 4c is a cross-sectional view along b-b' direction of FIG. 4a. Referring to FIG. 4a to FIG. 4c, the first trenches 13 have an extension direction along the <110> crystal orientation, namely, along the <110> crystal orientation family. As an embodiment rather than the limitation of the invention, the first trenches extend along the [110] crystal orientation herein. The extension direction of the second trenches 14 is perpendicular to that of the first trenches 13. The extension directions refer to the extension directions of both the first trenches 13 and the second trenches 14 along the surface of the silicon substrate 10.

Referring to FIG. 1, FIG. 5a to FIG. 5c, FIG. 6a to FIG. 6c, and FIG. 7a to FIG. 7c, Step S13 is performed to form a tensile stressed first dielectric layer in the first trenches, and form a second dielectric layer in the second trenches.

Figure 5A:
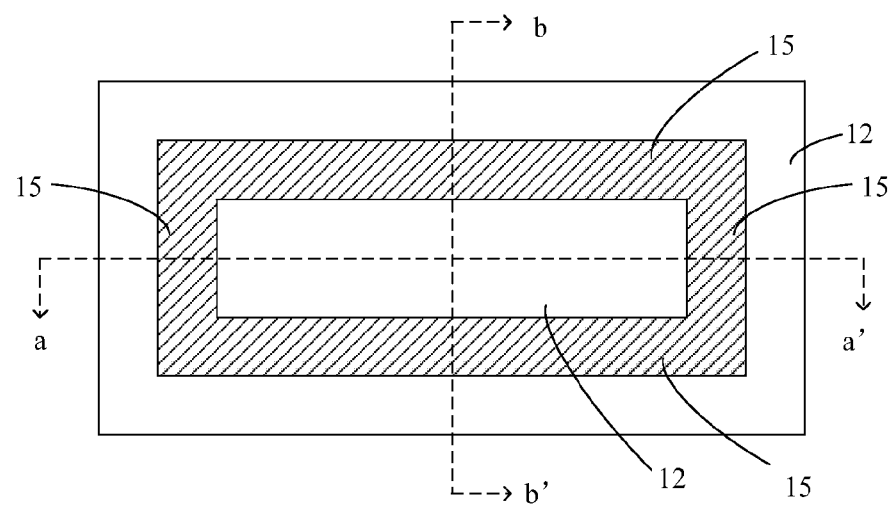
Figure 5B:
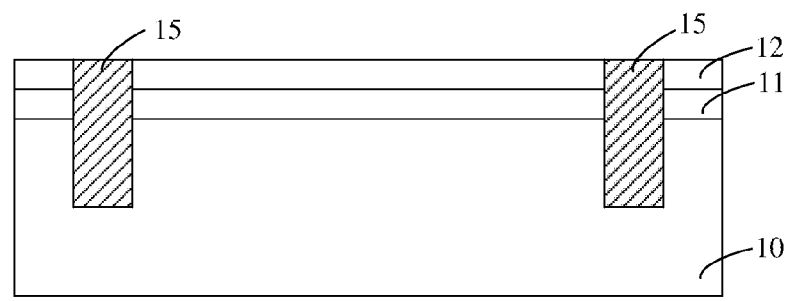
Figure 5C:
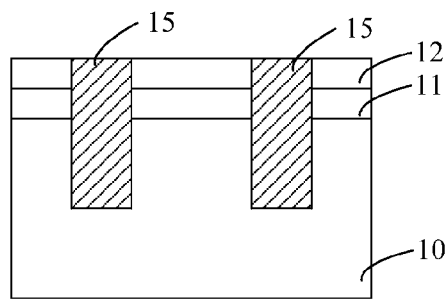

Specifically, a low stress dielectric layer 15 is formed in the first trenches and the second trenches. FIG. 5a is a top view of an intermediate structure after the low stress dielectric layer 15 is formed according to the embodiment, FIG. 5b is a cross-sectional view along a-a' direction of FIG. 5a, and FIG. 5c is a cross-sectional view along b-b' direction of FIG. 5a. Referring to FIG. 5a to FIG. 5c, the low stress dielectric layer 15 is formed (for example, by depositing) in the first trenches and the second trenches, and planarized until the top surface of the low stress dielectric layer 15 is flushed with that of the hard mask layer 12. The low stress dielectric layer 15 may be planarized by a CMP process. In other embodiments, if the liner layer 11 and the hard mask layer 12 are not formed in the former steps, the low stress dielectric layer 15 is planarized to be flushed with the top surface of the silicon substrate 10.

The low stress dielectric layer 15 may comprise one of a low stress silicon nitride layer and a low stress silicon oxide layer, or a stack of both, and may be formed by the PECVD process or the like. Those skilled in the prior art should understand that "low stress" means the stress of the low stress dielectric layer 15 is less than a certain threshold. Technical parameters can be adjusted during the formation process as in the prior art, so as to realize the magnitude adjustment of the stress of the low stress dielectric layer 15. Preferably, the stress of the low stress dielectric layer 15 is no more than 180 MPa.

Figure 6A:
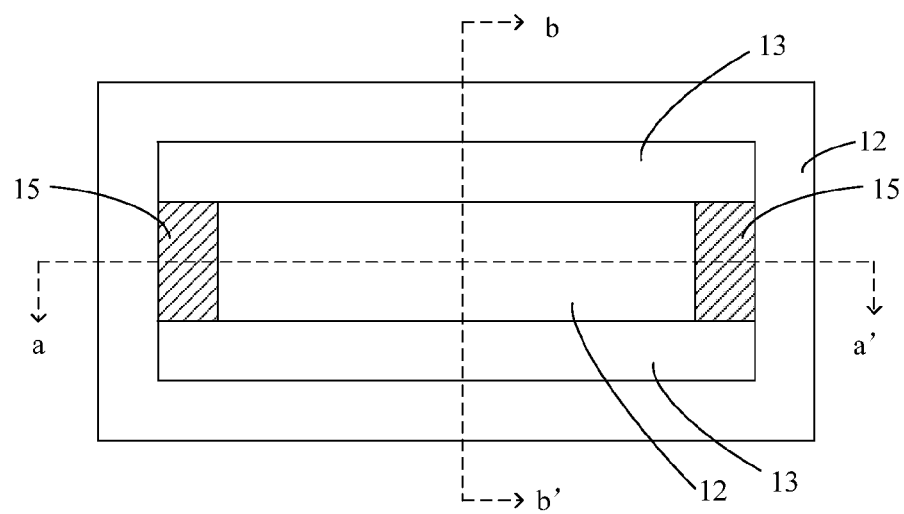
Figure 6B:
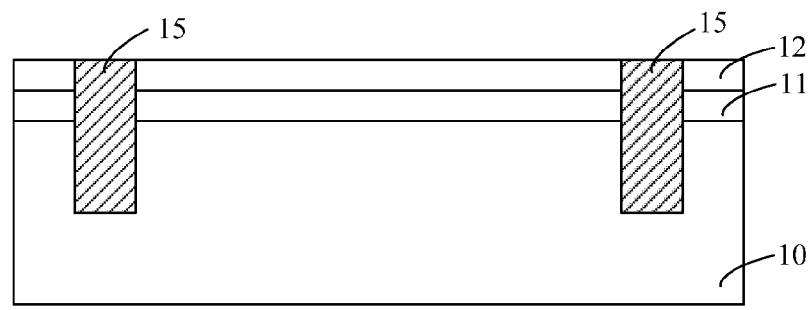
Figure 6C:
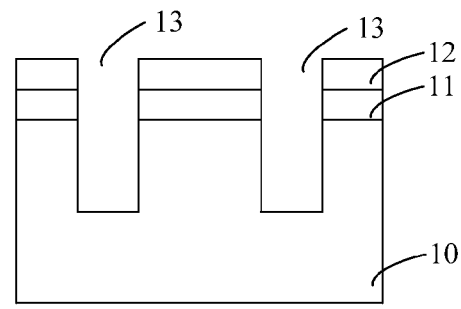

Thereafter, the low stress dielectric layer 15 in the first trenches 13 is removed. FIG. 6a is a top view of an intermediate structure after the low stress dielectric layer 15 in the first trenches 13 is removed according to the embodiment, FIG. 6b is a cross-sectional view along a-a' direction of FIG. 6a, and FIG. 6c is a cross-sectional view along b-b' direction of FIG. 6a. Referring to FIG. 6a to FIG. 6c, the low stress dielectric layer 15 in the first trenches 13 is removed, so that the first trenches 13 becomes a structure in which no materials are filled. Specifically, the method for removing the low stress dielectric layer 15 in the first trenches 13 comprises: forming a photoresist layer (not shown in the figures) on the hard mask layer 12 and patterning the photoresist layer to define the patterns of the first trenches; and performing an etching process to remove the low stress dielectric layer 15 by using the patterned photoresist layer as a mask. The etching process may be a wet etching or a dry etching.

Figure 7A:
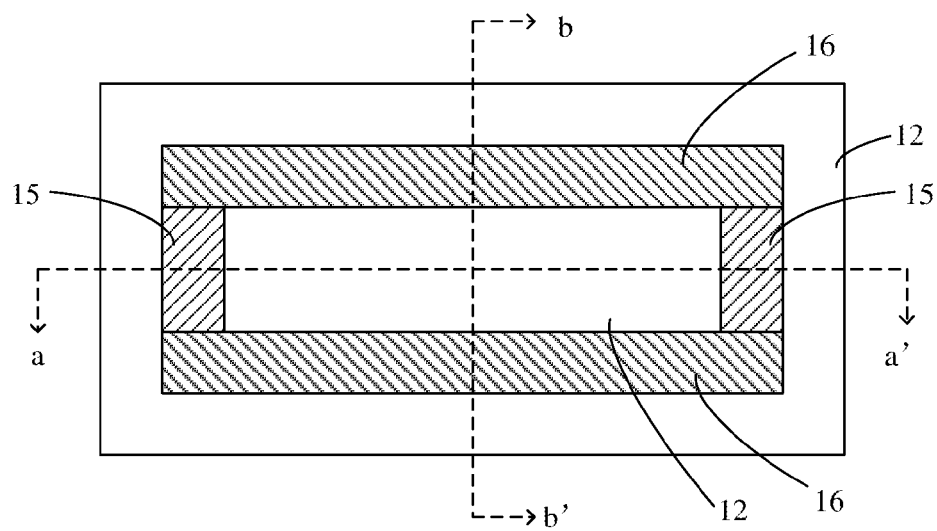
Figure 7B:
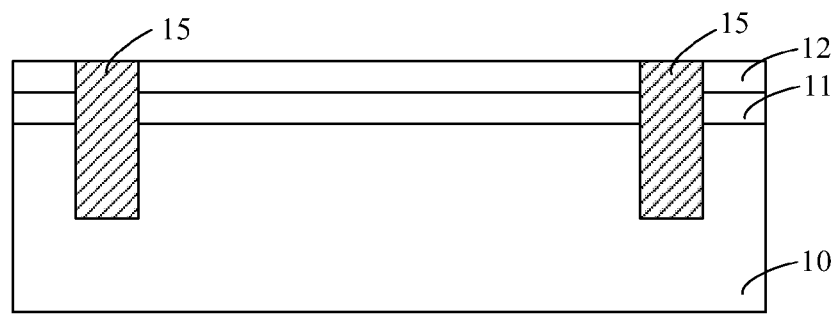
Figure 7C:
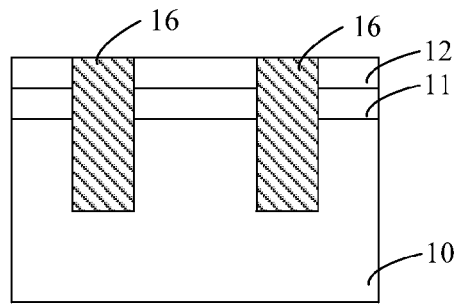

Thereafter, a tensile stress dielectric layer 16 is formed in the first trenches. FIG. 7a is a top view of an intermediate structure after the tensile stress dielectric layer 16 is formed according to the embodiment, FIG. 7b is a cross-sectional view along a-a' direction of FIG. 7a, and FIG. 7c is a cross-sectional view along b-b' direction of FIG. 7a. Referring to FIG. 7a to FIG. 7c, the tensile stress dielectric layer 16 is formed (for example, by depositing) in the first trenches, and planarized until the top surface of the tensile stress dielectric layer 16 is flushed with that of the hard mask layer 12. The tensile stress dielectric layer 16 may be planarized by a CMP process. In other embodiments, if the liner layer 11 and the hard mask layer 12 are not formed in the former steps, the tensile stress dielectric layer 16 is planarized to be flushed with the top surface of the silicon substrate 10.

The tensile stress dielectric layer 16 may comprise one of a tensile stress silicon nitride layer and a tensile stress silicon oxide layer, or a stack of both, and may be formed by the PECVD method or the like. Technical parameters can be adjusted during the formation process as in the prior art, so as to realize adjustment for the type and magnitude of the stress of the tensile stress dielectric layer 16. Preferably, the tensile stress of the tensile stress dielectric layer 16 is at least 1 GPa.

It should be noted that, as for the step S13, in other embodiments of the present invention, the formation for the sequence of the low stress dielectric layer and the tensile stress dielectric layer may be altered. For example, a tensile stress dielectric layer may be firstly formed in the first trenches and the second trenches; then a portion of the tensile stress dielectric layer in the second trenches is removed; and a low stress dielectric layer is formed in the second trenches.

Of course, the first trenches may be firstly formed and filled with a tensile stress dielectric layer directly; and then the second trenches are formed and filled directly with a low stress dielectric layer. Alternatively, the second trenches may be firstly formed and filled with a low stress dielectric layer; and then the first trenches are formed and filled with a tensile stress dielectric layer.

Referring to FIG. 1, and FIG. 8a to FIG. 8c, Step S14 is performed to form a gate stack in a portion of the silicon substrate surrounded by both the first trenches and the second trenches. The channel length direction under the gate stack is parallel to the extension direction of the first trenches. The silicon substrate has {100} crystal indices, and the extension direction of the first trenches is along the <110> crystal orientation. The gate stack is a gate stack in a MOS transistor, and the channel length is the channel length of the MOS transistor to which the gate stack belongs. Detailed description will be given below.

Figure 8A:
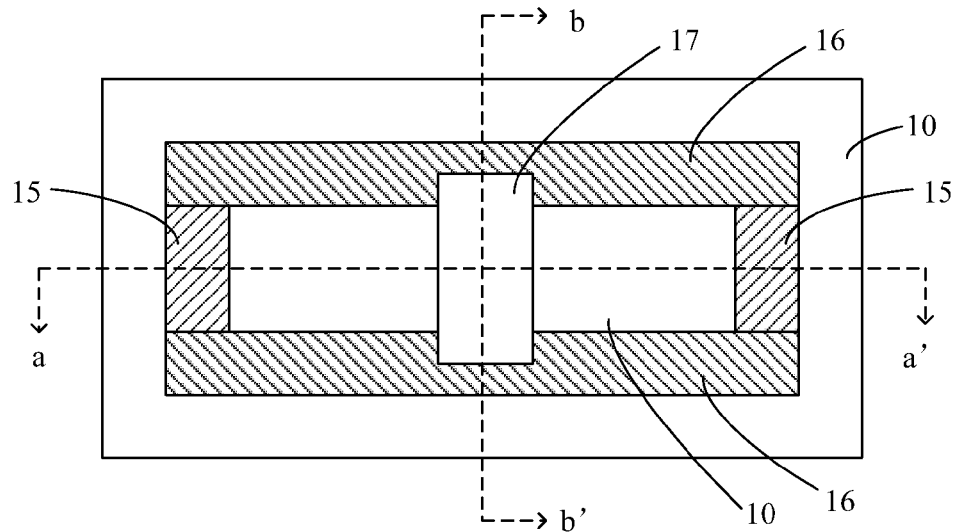
Figure 8B:
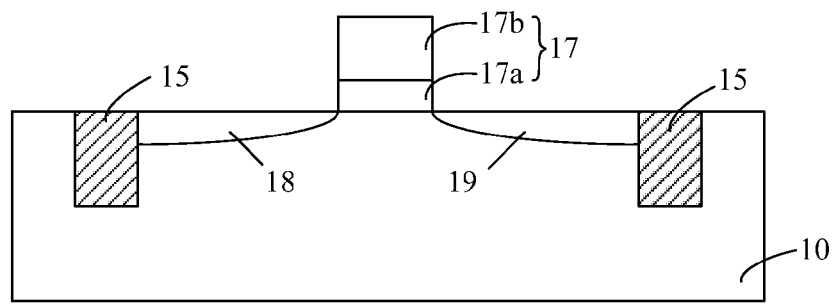
Figure 8C:
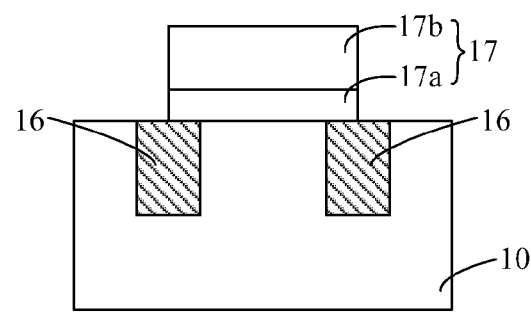

FIG. 8a is a top view of an intermediate structure after a MOS transistor is formed according to the embodiment, FIG. 8b is a cross-sectional view along a-a' direction of FIG. 8a, and FIG. 8c is a cross-sectional view along b-b' direction of FIG. 8a. Referring to FIG. 8a to FIG. 8c, the formation process of the MOS transistor may comprise: removing the liner layer and the hard mask layer on the surface of the silicon substrate 10; forming a gate stack 17 on the silicon substrate 10 surrounded by the first trenches and the second trenches, wherein the gate stack 17 comprises a gate dielectric layer 17a and a gate electrode 17b, and in one embodiment, the gate stack 17 may further comprise spacers (not shown in the figures) on sidewalls of both the gate dielectric layer 17a and the gate electrode 17b, and the extension direction of the gate stack 17 is parallel to the extension direction of the second trenches; by using the gate stack 17 as a mask, implanting ions into the silicon substrate 10 surrounded by the first trenches and the second trenches, so as to form a source region 18 and a drain region 19 in the silicon substrate 10 on opposite sides of the gate stack 17, respectively. The type of the implanted ions may be determined by the MOS transistor type. For instance, the ions may be p-type for a PMOS transistor, such as boron, and the ions may be n-type for an NMOS transistor, such as phosphorus. The direction from the source 18 to the drain 19 is the direction of the channel length, which is parallel to the extension direction of the first trenches. The extension direction of the gate stack 17 is the direction of the channel width, which is parallel to the extension direction of the second trenches.

Up to now, a semiconductor device with stress trench isolation formed according to the embodiment is shown in FIG. 8a-8c, comprising: the silicon substrate 10; the first trenches and the second trenches formed in the silicon substrate 10, wherein the extension direction of the first trenches is perpendicular to that of the second trenches, the tensile stress dielectric layer 16 is filled in the first trenches, and the low stress dielectric layer 15 is filled in the second trenches; and the MOS transistor formed on a portion of the silicon substrate 10 surrounded by the first trenches and the second trenches, the direction of the channel length of the MOS transistor is parallel to the extension direction of the first trenches. The silicon substrate has {100} crystal indices, and the extension direction of the first trenches is along the <110> crystal orientation.

The first trenches which are located at opposite sides of the channel width direction of the MOS transistor are filled with the tensile stress dielectric layer 16, and the second trenches which are located at opposite sides of the channel length direction of the MOS transistor are filled with the low stress dielectric layer 15, so that the tensile stress is selectively applied in the channel width direction of the MOS transistor by the trench isolation, which consequently increases response speed of the device and improves performance of the device. This technical solution can be applied both in PMOS and NMOS transistors, which may be combined with standard CMOS processes and improve response speed of every device in the whole CMOS circuits.

Figure 9:
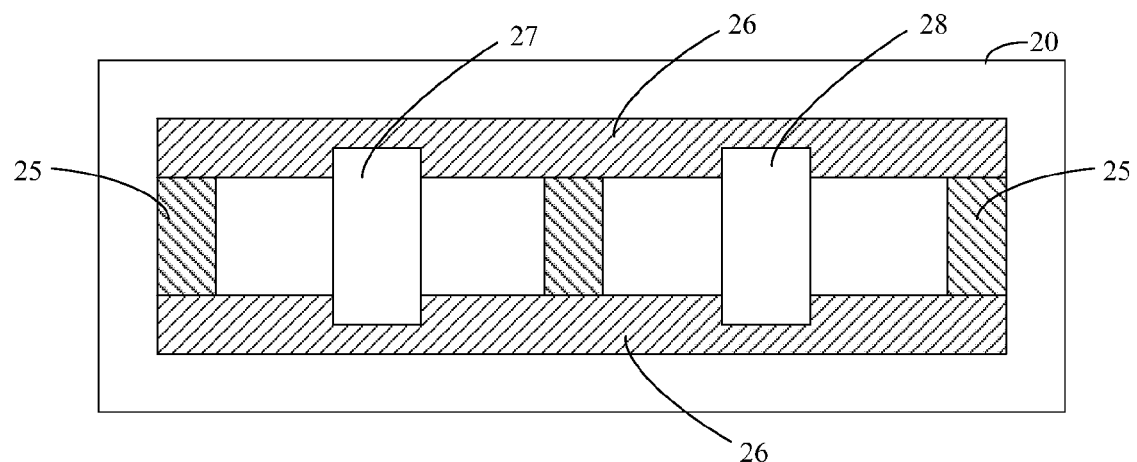
FIG. 9 is a top view of a semiconductor device formed by a method for forming a semiconductor device with stress trench isolation according to another embodiment of the present invention.

FIG. 9 is a top view of another semiconductor device according to the embodiment of the present invention. The semiconductor device comprises: a silicon substrate 20; first trenches and second trenches formed in the silicon substrate 20, wherein an extension direction of the first trenches is perpendicular to that of the second trenches, a tensile stress dielectric layer 26 is filled in the first trenches, and a low stress dielectric layer 25 is filled in the second trenches; and a PMOS transistor and an NMOS transistor formed on a portion of the silicon substrate 10 surrounded by the first trenches and the second trenches, each of the direction of the channel length for the PMOS transistor and the NMOS transistor is parallel to the extension direction of the first trenches, the PMOS transistor comprises a gate stack 27 and a source region and a drain region in the silicon substrate 20 on opposite sides of the gate stack 27, the NMOS transistor comprises a gate stack 28 and source and drain regions in the silicon substrate 20 on both sides of the gate stack 28. The silicon substrate has {100} crystal indices. FIG. 9, which is only illustrative rather than limiting the invention, shows only one PMOS transistor and one NMOS transistor. However, in other embodiments, more than one PMOS transistor and NMOS transistor may be formed according to practical requirements, and may be interconnected to form a CMOS circuit by the upper interconnecting structure.

In the semiconductor device with stress trench isolation formed in the above embodiment, the first trenches along the channel length direction of the MOS transistor are filled up with the tensile stress dielectric layer. In other words, in channel width direction, the tensile stress dielectric layer is located at opposite sides of the MOS transistor, which provides tensile stress in the channel width direction of the MOS transistor by the trench isolation structure, thereby benefiting the MOS transistor by increasing response speed and improving performance. In addition, this technical solution can be applied to both PMOS and NMOS transistors, which may improve performance of the whole circuit formed by the CMOS process.

It should be noted that in the 45 nm technical node and below, in order to simplify the lithography process, during the semiconductor manufacturing process, gate stack of all the MOS transistors have consistent extension directions. According to the embodiments of the present invention, the first trenches and the second trenches may be formed on the silicon substrate and may be interconnected to form rectangular grids. Afterwards, the gate stacks having the same extension direction are respectively formed on the silicon substrate in each rectangular region surrounded by the first trenches and the second trenches, thereby simplifying the process for forming the CMOS circuits. Therefore, the embodiments of the present invention can be widely applied in the semiconductor manufacture technology of 45 nm technical node and below, and can apply a tensile stress in the channel width direction to all of the MOS transistors and improve the device performance. Therefore, the embodiments of the present invention can not only fully utilize stressed STIs, but also can improve performance of both PMOS and NMOS transistors. Moreover, the embodiments of the present invention are easy to implement and have good applicability in industry.

Furthermore, after forming the MOS transistors, the technical solution in the embodiment of the invention can be incorporated with a dual-stress liner technique. Specifically, a tensile stress liner layer can be formed in the NMOS transistor and a compressive stress liner layer can be formed in the PMOS transistor, so as to further increase response speed of the device and improve device performance Although the present invention has been disclosed as above with reference to preferred embodiments, it is not intended to limit the present invention. Those skilled in the art may modify and vary the embodiments without departing from the spirit and scope of the present invention. Accordingly, the scope of the present invention shall be defined in the appended claims.

What is claimed is:

1. A method for forming a semiconductor device with stress trench isolation, comprising:
   providing a silicon substrate;
   forming first trenches and second trenches on the silicon substrate, wherein an extension direction of the first trenches is perpendicular to that of the second trenches;
   forming a first dielectric layer, which is under tensile stress, in the first trenches and forming a second dielectric layer in the second trenches; and
   forming a gate stack on a portion of the silicon substrate surrounded by the first trenches and the second trenches, wherein a channel length direction under the gate stack is parallel to the extension direction of the first trenches, the silicon substrate has {100} crystal indices, and the extension direction of the first trenches is along <110>crystal orientation; and
   wherein the semiconductor device comprises at least one NMOS transistor and at least one PMOS transistor;
   wherein a tensile strain in a channel width direction for both NMOS and PMOS is formed by the first dielectric layer under tensile stress, which is filled the first trenches in parallel to the channel length direction;
   channel regions of the NMOS and the PMOS are both under the tensile strain in the channel width direction; and
   the channel length direction of the NMOS and the channel length direction of the PMOS are both parallel to the extension direction of the first trenches.

2. The method according to claim 1, wherein the second dielectric layer is a low stress dielectric layer.

3. The method according to claim 2, wherein the low stress dielectric layer has a tensile stress of no more than 180 MPa.

4. The method according to claim 2, wherein the low stress dielectric layer comprises one of a low stress silicon nitride layer and a low stress silicon oxide layer, or a stack of both.

5. The method according to claim 1, wherein the first dielectric layer has a tensile stress of at least 1 GPa.

6. The method according to claim 1, wherein the first dielectric layer comprises one of a tensile stress silicon nitride layer and a tensile stress silicon oxide layer, or a stack of both.

7. The method according to claim 1, wherein forming first trenches and second trenches on the silicon substrate comprises:
   forming a liner layer and a hard mask layer on the silicon substrate sequentially;
   forming a photoresist layer on the hard mask layer and patterning the photoresist layer to define patterns of the first trenches and the second trenches;
   etching the liner layer and the hard mask layer by using the patterned photoresist layer as a mask, and removing the photoresist layer; and
   etching the silicon substrate by using the hard mask layer as a mask so as to form the first trenches and the second trenches.

8. The method according to claim 1, wherein forming the first dielectric layer, which is under tensile stress, in the first trenches and forming the second dielectric layer in the second trenches comprises:
   forming the second dielectric layer in both the first trenches and the second trenches, and planarizing the second dielectric layer until a top surface of the second dielectric layer is flushed with that of the silicon substrate;
   removing a portion of the second dielectric layer in the first trenches; and
   forming the first dielectric layer in the first trenches, and planarizing the first dielectric layer until a top surface of the first dielectric layer is flushed with that of the silicon substrate.

9. The method according to claim 1, wherein forming the first dielectric layer, which is under tensile stress, in the first trenches and forming the second dielectric layer in the second trenches comprises:
   forming the first dielectric layer in both the first trenches and the second trenches, and planarizing the first dielectric layer until a top surface of the first dielectric layer is flushed with that of the silicon substrate;
   removing a portion of the first dielectric layer in the second trenches; and
   forming the second dielectric layer in the second trenches, and planarizing the second dielectric layer until a top surface of the second dielectric layer is flushed with that of the silicon substrate.

10. A semiconductor device with stress trench isolation, comprising:
    a silicon substrate;
    first trenches and second trenches formed in the silicon substrate, wherein an extension direction of each of the first trenches is perpendicular to that of the second trenches, a first dielectric layer, which is under tensile stress, is formed in the first trenches, and a second dielectric layer is formed in the second trenches; and
    a gate stack formed on a portion of the silicon substrate surrounded by the first trenches and the second trenches, wherein a channel length direction under the gate stack is parallel to the extension direction of the first trenches, the silicon substrate has {100} crystal indices, and the extension direction of the first trenches is along <110>crystal orientation;
    wherein the semiconductor device comprises at least one NMOS transistor and at least one PMOS transistor;
    wherein a tensile strain in a channel width direction for both NMOS and PMOS is formed by the first dielectric layer under tensile stress, which is filled the first trenches in parallel to the channel length direction;
    channel regions of the NMOS and the PMOS are both under the tensile strain in the channel width direction; and
    the channel length direction of the NMOS and the channel length direction of the PMOS are both parallel to the extension direction of the first trenches.

11. The semiconductor device with stress trench isolation according to claim 10, wherein the second dielectric layer is a low stress dielectric layer.

12. The semiconductor device with stress trench isolation according to claim 11, wherein the low stress dielectric layer has a tensile stress of no more than 180 MPa.

13. The semiconductor device with stress trench isolation according to claim 11, wherein the low stress dielectric layer comprises one of a low stress silicon nitride layer and a low stress silicon oxide layer, or a stack of both.

14. The semiconductor device with stress trench isolation according to claim 10, wherein the first dielectric layer has a tensile stress of at least 1GPa.

15. The semiconductor device with stress trench isolation according to claim 10, wherein the first layer comprises one of a tensile stress silicon nitride layer and a tensile stress silicon oxide layer, or a stack of both.

* * * * *